United States Patent [19]

Hiraishi et al.

[11] Patent Number: 4,501,809
[45] Date of Patent: Feb. 26, 1985

[54] PHOTOSETTING MICROCAPSULES AND PHOTO- AND PRESSURE-SENSITIVE RECORDING SHEET

[75] Inventors: Shigetoshi Hiraishi, Tokyo; Sadao Morishita, Ibaraki; Toshihiko Matsushita, Funabashi, all of Japan

[73] Assignee: Mitsubishi Paper Mills, Ltd., Tokyo, Japan

[21] Appl. No.: 398,280

[22] Filed: Jul. 14, 1982

[30] Foreign Application Priority Data

Jul. 17, 1981 [JP] Japan .................. 56-111722
Jul. 22, 1981 [JP] Japan .................. 56-114620
Jul. 24, 1981 [JP] Japan .................. 56-116213
Aug. 3, 1981 [JP] Japan .................. 56-121613
Aug. 3, 1981 [JP] Japan .................. 56-121614

[51] Int. Cl.$^3$ .................. G03C 1/68; G03C 5/54
[52] U.S. Cl. .................. 430/138; 430/211; 430/235; 346/214
[58] Field of Search .................. 430/138, 211, 235; 428/320.6, 402.21, 402.22; 282/27.5

[56] References Cited

U.S. PATENT DOCUMENTS 3,219,446 11/1965 Berman .................. 430/138
3,576,660 4/1971 Bayless et al. .................. 428/320.8
4,165,398 8/1979 Raine et al. .................. 428/320.8
4,372,582 2/1983 Geisler .................. 428/320.8
4,399,209 8/1983 Sanders et al. .................. 430/138
4,440,846 4/1984 Sanders et al. .................. 430/138

FOREIGN PATENT DOCUMENTS 49-6212 2/1974 Japan .................. 430/138

OTHER PUBLICATIONS

Japanese Patent Early Publication (Laid Open) No: 124343/1982, Date of Publication: Aug. 3, 1982, Inventor: Masato Satomura.

*Primary Examiner*—John E. Kittle
*Assistant Examiner*—Cynthia Hamilton
*Attorney, Agent, or Firm*—Cushman, Darby & Cushman

[57] ABSTRACT

A photosetting microcapsule containing a photosetting resin and a photopolymerization initiator can be controlled in rupture thereof. By utilizing such characteristics of said microcapsule and by using in combination said photosetting microcapsules containing a reactant such as an electron donative compound and the microcapsules containing a co-reactant such as an electron receptive compound capable of forming a colored material by reacting with said reactant or finely powdered co-reactant per se, there is provided a photo- and pressure-sensitive recording sheet which is capable of copying even a positive type original to provide a copy or copies with excellent keeping quality without causing any coloration or discoloration in the portion other than the characters, etc., of the original.

15 Claims, No Drawings

PHOTOSETTING MICROCAPSULES AND PHOTO- AND PRESSURE-SENSITIVE RECORDING SHEET

This invention relates to a rupture-controllable photosetting microcapsule and a photo- and pressure-sensitive recording sheet utilizing such microcapsules.

Microcapsule is a fine particle with a size of from about 1 $\mu$m to several hundred $\mu$m having encapsulated therein a liquid, a solid or a gas and uniformly walled by a thin film of several m$\mu$m to several $\mu$m thickness. Ever since such microcapsules were disclosed in U.S. Pat. Nos. 2,711,376 and 2,712,507, they have been utilized for a variety of uses. Most popular among the uses of such microcapsules is their application to pressure-sensitive recording paper. The pressure-sensitive recording paper utilizing said microcapsules consists, in laminar combination, of a top sheet prepared by coating the back side of a support with the microcapsules containing an oily substance formed by dissolving a color forming agent, which is a colorless electron donative dye precursor, in a non-volatile solvent and a bottom sheet prepared by coating the front side of another support with a color developer which is a colorless electron receptive acidic material, said top and bottom sheets being laminated such that their respective coated sides oppose to each other, and in use of such recording paper, when a writing pressure is applied thereto, the microcapsules are ruptured to release the content thereof, causing contact of the color forming agent with the color developer to induce a chemical reaction therebetween to form a colored material on the front side of the bottom sheet and such colored material provides a copy image. Thus, the microcapsule, which encloses a substance having certain specific properties in a thin-film wall, is capable of confining said specific properties, too, of the contained substance, and such substance can be released when so desired by rupture of the thin wall film. Even when two different substances are reactive to each other, since they can be isolated from each other by encapsulization thereof, there takes place no reaction therebetween even if capsules remain mixed with each other for a long time, and they are allowed to react with each other only when the microcapsules are ruptured to allow them to contact each other. Thanks to such arrangements, the microcapsules have come to be utilized for a wide variety of commercial products including recording materials, drugs, foods, cosmetics, adhesives, agricultural chemicals, artificial human organs, etc.

Further, it is now possible to produce those microcapsules which are capable of gradual release of the contained material by changing the degree of polymerization or crosslinking of the microcapsule wall film or its permeability, or those microcapsules which can be easily ruptured by application of a weak force or which can not be easily ruptured even under application of a strong force, by changing the size or wall thickness of the capsules. Also, application of a pressure is not the only means for rupturing the capsules; there have been deviced various other means such as utilization of heat, light, electric current, moisture, etc. For instance, U.S. Pat. No. 3,212,896, Japanese Patent Publication Nos. 26589/69 and 26597/74 and Japanese Patent Laid-Open Application No. 145046/77 disclose the microcapsules which are fused and ruptured by heating to release the contained material, and Japanese Patent Laid-Open Application No. 109078/79 proposes light irradiation for enfeebling and rupturing the capsule film, while Japanese Patent Laid-Open Application No. 99969/75 shows the idea of rupturing the capsule film by contacting the microcapsules with water.

All of these microcapsules have been developed by designing their film wall properties with an eye to effecting positive release of the content material of the microcapsules when so desired. It is however impossible with these microcapsules to freely control rupture thereof as occasion calls, such as in the case where there is no further need for the content material of the capsules and it is not desired to rupture the capsules any more, or in the case where it is desired to release the content material of only a part of the capsules. Thus, these microcapsules, once prepared, are always left in a state of being ready to rupture.

As a result of the studies for obtaining a rupture-controllable microcapsule, the present inventors have succeeded in producing a microcapsule which can be freely controlled in its rupture by containing both a photosetting resin and a photopolymerization initiator in the microcapsule.

The photosetting microcapsule of this invention containing principally a photosetting resin and a photopolymerization initiator is of the type which is controlled in its rupture by means of light. When it is desired to release the content material of the capsules, such can be accomplished by externally applying a pressure, heat, moisture or such to the capsules to rupture their films as in the case of the ordinary microcapsules, and when it is desired to keep the material within the capsules, light is applied to the microcapsules. The light which has passed the film hardens the photosetting resin contained in the capsules to change it into a hard resin. As a result, the photosetting microcapsules are turned into the rigid capsules from the inside and do not rupture even if an impact, etc., is applied thereto from the outside and hence no release of the content material occurs. Also, the degree of release of the content material can be controlled by adjusting the volume of light applied.

It is essential for the photosetting microcapsule of this invention to contain a photosetting resin and a photopolymerization initiator, but it may also contain other optional substance or substances. Such optional substances, though not specified, are the organic or inorganic substances which are used in agricultural chemicals, foods, cosmetics, catalysts, adhesives, curing agents, oxidizers, reducers, dyestuffs, pigments, plasticizers, high polymer flocculating agents, anticorrosives, antioxidants, soil conditioners, etc., and such substances may be contained in the form of a solid or a liquid.

The photosetting microcapsule of this invention finds a variety of uses in various fields. For instance, when a reactive substance is added as a part of the content of the photosetting microcapsules and said capsules are coated on a support and then exposed to light, there can be produced the microcapsules different in degree of hardening and content release rate according to the amount of light exposure. Thereafter, when the capsules are layered on a support coated with a co-reactive substance which reacts with the reactive substance to form a colored material and a pressure is applied thereon, there is provided a light sensor which is capable of indicating the light exposure by way of the shade of color. Further, when a support coated with the photosetting microcapsules added with a reactive substance is superposed on an original and exposed, since the light does not pass or reflect at the drawing portion of the original, said capsules in such portion remain in the state as they are, but since the light reaches the other portions, said capsules are hardened from the inside. Thereafter, when this is superposed on an image-receiving sheet coated with a co-reactive substance and a pressure is applied thereon, a copy image of the original is obtained on said image-receiving sheet. Thus, the microcapsules of this invention can be used for the copying material which is capable of forming plural number of copies. Use of the microcapsules of this invention is not limited to these applications; they can as well be used freely in other areas where the function of the photosetting microcapsules can be utilized.

As the photosetting resin to be contained in the photosetting microcapsules of this invention, there may be used the photo-dimerization type resins having the photosensitive groups such as cinnamic acid residue, cinnamylidene residue, $\alpha,\beta$-unsaturated ketone residue, coumarin residue, anthracene residue, $\alpha$-phenylmaleimide residue, benzophenone residue, stilbene residue, etc., photo-decomposition type resins having the photosensitive groups such as diazonium salt residue, quinonediazido residue, azido residue, dithiocarbamate residue, benzoin residue, etc., and the photopolymerization type resins having acryloyl group, allyl group, vinyl group, epoxy group, etc., but the photopolymerization type resins are most preferred. As for the form of such resin for use in this invention, it is advantageous to use said resin in a liquid form. Any known commonly used compound may be employed as the photopolymerization initiator for polymerizing the photosetting resin, but it may contain other substances such as benzoinalkyl ether, benzophenone, Michler's ketones, thioxanthones, acetophenones, etc., a photosensitizer assistant helpful for expanding the sensitizing wavelength region of the photopolymerization initiator such as anthraquinone, 5-nitrofluorene, etc., a stabilizer or modifier such as a radical polymerization inhibitor for improving the keeping quality, a dilutent such as a relatively low-molecular-weight oligomer or monomer, and so on. In some cases, in order to improve the solubility of the contained materials such as reactant, a high-boiling-point oily solvent such as alkylnaphthalenes, alkylbiphenyls, alkylidenebiphenyls, esters and the like may be used as a dissolution assistant, but use of such solvent in large quantities is not recommended because of a deterious influence to the hardening of the content material.

The photopolymerization initiator used in this invention may be added in an amount of about 0.01 to about 10% by weight of the photosetting resin.

Ultraviolet light is usually used for effecting hardening of the photosetting capsules of this invention. The light source may be sun light, xenon lamp, low or high pressure mercury arc lamp, fluorescent lamp or the like. There is seen substantially no deterioration of the photosetting capsule properties due to exposure such as provided by room lamp or indirect sun light, in the course of production or during the period of ordinary treatment.

The microcapsules of this invention can be produced by the various methods known in the art, for example, a phase separation method from an aqueous solution such as disclosed in U.S. Pat. Nos. 2,800,457 and 2,800,458, an interfacial polymerization method such as shown in Japanese Patent Publication Nos. 19574/63, 446/67 and 771/67, an in situ method by monomer polymerization such as taught in Japanese Patent Publication No. 9168/61 and Japanese Patent Laid-Open Application No. 9079/76, a fusion-dispersion-cooling method such as disclosed in British Pat. Nos. 952,807 and 965,074, and a spray drying method proposed in U.S. Pat. No. 3,111,407 and British Pat. No. 930,422. Other suitable methods may be optionally employed.

As the capsule wall film forming material, there may be used gelatin, gum arabic, starch, sodium alginate, ethyl cellulose, carboxymethyl cellulose, polyvinyl alcohol, polyethylene, polyamide, polyester, polyurethane, polyethyleneimine and the like, but it is recommended to select a material which is well permeable to light, particularly ultraviolet light, in the production of the photosetting microcapsules.

Availability of the photosetting microcapsules according to this invention for a wide variety of uses has already been mentioned, but the microcapsules of this invention find the effective application to the photo- and pressure-sensitive recording paper.

In the following, a detailed discussion is made on such type of recording paper.

The currently available copying methods are diversified, including mechanical methods, optical methods, photographic methods, thermal methods, etc. Most of these methods, however, require a developing step and other operations such as treatment with the fixing agent, and thus many of them are still unsatisfactory in ease of operation, cost, cleanness and such matters.

As an improvement over these points, Japanese Patent Publication No. 20852/79 discloses a copying technique according to which a material which changes into a dye precursor upon ultraviolet-light exposure is dissolved in a solvent and this solution is encapsulated and coated on a sheet, and then an original is placed on this coated sheet and exposed to ultraviolet light, followed by placing of an image-receiving sheet thereunder and pressing to thereby obtain a colored image on that area of the image-receiving sheet which corresponds to the exposed portion of the microcapsule coating which has changed into a dye precursor. This copying method, although simple in operation, involves several drawbacks such as mentioned below. According to this method, since a color image is obtained only on that area of the image-receiving sheet which corresponds to the ultraviolet-light exposed portion, the original usable for copying is limited to a negative type such as photographic negative, and when an attempt is made to copy an ordinary handwritten manuscript or a positive type original such as a book, in the character portion may be developed no-color and other portion than the characters may be colored, so that this copying method is unfavorable for ordinary copying practice. Also, the microcapsules on the whole surface are ruptured by pressure, causing transfer of the encapsuled material and liquid to the entire surface of the image-receiving sheet regardless of ultraviolet-light exposure, so that the material may fail to become a dye precursor upon ultraviolet-light exposure and, as a result, the portion of the image-receiving sheet which must not be colored might be colored slightly, giving a degradating influence to the keeping quality of the copies.

In view of the above, the present inventors have pursued further studies on the recording sheet and copying method which are free of said problems and which are easy of operation, inexpensive, free of soiling and applicable to ordinary copying practice and, as a result, have succeeded in obtaining a copy image quite faithful to the original on an image-receiving sheet by placing an original to be copied on a photo- and pressure-sensitive type recording sheet provided with a photo- and pressure-sensitive layer principally composed of said photosetting microcapsules of this invention, that is, the microcapsules containing a photosetting resin and a photopolymerization initiator as well as a reactant, and after exposure, placing said sheet on an image-receiving sheet having an image-receiving layer principally composed of a co-reactant which forms a colored material when contacted with said reactant.

Thus, according to this invention, an original to be copied and a photo- and pressure-sensitive recording sheet coated with a photo- and pressure-sensitive layer principally composed of the reactant-containing photosetting microcapsules of this invention are placed overlapping each other such that the coated side of said sheet is attached to the side to be copied of the original, and then they are exposed to light from the original side in case the original is made of a material which easily transmits light, particularly ultraviolet light, and from the recording sheet side using a transparent or substantially transparent support in case the original is one through which light can not easily pass, such as a book. The exposure time may be suitably adjusted according to the combination of said recording sheet and original. The recording sheet at the portions of drawings and characters of the original does not sense the light since the light is absorbed in these portions, but other portions sense the light as the light passes or reflect at these portions, causing hardening of the content material of the capsules coated on these portions. Thereafter, said recording sheet is superposed, at its coated side, on an image-receiving sheet carrying a co-reactant which forms a colored material upon reaction with said reactant, and the whole surface of the dual sheet is pressed by a roll or other means, whereby the microcapsules at the portions of the recording sheet which have not sensed the light, that is, the portions corresponding to the drawing and character portions of the original, are ruptured with the result that the reactant constituting a part of the capsule content exudes and transfers onto the image-receiving sheet to form a color image thereon. The microcapsules at the area which have sensed the light are not ruptured even when pressure is applied thereto since these microcapsules themselves are hardened, so that no transfer is made of the content of these microcapsules onto the image-receiving sheet and hence no color development occurs in this area. In this way, a copy image true to the original is obtained on the image-receiving sheet.

The photo- and pressure-sensitive recording sheet according to this invention, as already apparent, allows copying of all ordinary positive type originals including any handwritten manuscript or printed matters such as books. Also, according to the recording sheet of this invention, only the microcapsules at the portions corresponding to the drawings and characters of the original are ruptured to form a color image on the image-receiver sheet and there takes place no coloration or discoloration at the parts other than the drawings and characters, so that the sheet has very excellent keeping quality.

It is possible to obtain a plural number of copies by using the photo- and pressure-sensitive recording sheet of this invention. When said recording sheet and an original are put together and exposed and the sheet is placed overlapping an image-receiving sheet and pressed by a rubber roller or other means, a copy image of the original is obtained on the image-receiver sheet, but even after this first copying operation, there still remains a substantial portion of the liquid photosetting resin and reactant in the ruptured capsules in the recording sheet, so that by repeating the same copying operation as said above by using another image receiver sheet, there can be obtained a copy image of the original on this image receiver sheet. In this way, it is possible to obtain several copies of the original by using a single recording sheet.

The image-receiving sheet used in this invention may be produced in various ways, for example, by a method in which a co-reactant is dissolved and dispersed in a solvent and impregnated in a support, or a method in which an aqueous dispersion of a co-reactant is added with a binder, pigment, etc., and coated or printed partially or entirely on a support by using any suitable coater or printer.

In the case of said recording paper, it is impossible to obtain a desired color image unless a recording sheet (photo- and pressure-sensitive sheet) and an image-receiving sheet are used in combination.

Further, according to this invention, there is provided a monosheet type recording sheet which is free of said defects, easy to obtain, inexpensive, free of any fear of soiling and applicable to ordinary copying by retaining on the same side of a support said photosetting microcapsules of this invention to which a reactant is added and a finely powdered co-reactant which forms a colored material by reacting with said reactant or ordinary microcapsules containing the co-reactant.

An original to be copied is put together with the recording sheet coated with a photosensitive and pressure-sensitive layer mainly composed of the photosetting microcapsules containing a reactant and (1) the usual microcapsules containing a co-reactant which forms a colored material upon contact with the reactant or (2) finely powdered co-reactant, and this combination is exposed in the same manner as in the case of the above-said two-sheet type recording sheet to expose to light the portions other than the drawing and character portions of the original, whereby only the content of the photosetting microcapsules coated at such exposed portions is hardened. When the exposed recording sheet is pressed by a roll or other means, the photosetting microcapsules which have not been hardened at the portions corresponding to the drawings, characters, etc., of the original are ruptured, causing contact of the reactant released from said photosetting microcapsules with (1) co-reactant released from the microcapsules which are also ruptured or (2) the finely powdered co-reactant to produce a colored material, thereby recording the same drawings, characters, etc., as those of the original.

As described above, the photo- and pressure-sensitive recording sheet of this invention allows copying of any ordinary positive type original and such copying can be accomplished by use of a single recording sheet and no developing step is required, so that the copying operation is simple and easy to carry out.

Said photo- and pressure-sensitive recording sheet of this invention can be applied as a photo-fixable self contained pressure-sensitive recording sheet. The "self contained recording sheet" is a recording sheet of the type in which, as disclosed in U.S. Pat. Nos. 2,929,736, 3,576,660 and 3,672,935, microcapsules containing a reactant and microcapsules containing a co-reactant or microcapsules containing either one of the reactant or the co-reactant and the reactant or the co-reactant as it is which is not contained in microcapsules are provided on one side of the support sheet, and when a writing pressure is applied on the coated side of the sheet, the microcapsules in the pressed portion are ruptured to allow the reactant and the co-reactant to contact with each other to form a color image. According to this self contained type pressure sensitive recording sheet, only a single recording sheet is needed for obtaining a color image, that is, a recorded image, and this type of recording sheet has a particular advantage that it does not require a combination of a top sheet and a bottom sheet as compared with the popularly used pressure-sensitive paper which consists of a top sheet having a reactant-containing microcapsule layer provided on a support and a bottom sheet having a co-reactant-containing layer provided on a support, said both top and bottom sheets being layered with their respective coated sides facing each other so that when a writing pressure is applied thereon, the microcapsules in the top sheet are ruptured and the content thereof reacts with the co-reactant to form a color image on that part of the bottom sheet where pressure was applied. This type of recording sheet, however, is not popularly used. This is due to the serious defect of this type of sheet in that if the sheet, which has undergone color recording, is rubbed or given a force such as writing pressure either intentionally or inadvertently, there could occur additional color development in other part than the recorded image, resulting in staining or deformation of the recorded image.

In the case of the photo- and pressure-sensitive recording sheet of this invention, it is also possible to fix the recorded image with light, and by making use of this fact, the sheet of this invention can be applied as a self contained type recording sheet which is freed of said defect. The fixing of the recorded image with light can be accomplished in the following way. One or a plural number of the photo- and pressure-sensitive recording sheets coated with a photosensitive and pressure sensitive layer mainly composed of the reactant-containing photosetting microcapsules and the co-reactant-containing microcapsules or a finely powdered co-reactant which are superposed with the coated side facing up, and pressure is applied thereon by impressing characters, e.g., by a typewriter without any ribbon, whereby the microcapsules in the pressure-applied portions are ruptured to allow the reactant and co-reactant to contact each other to form a colored material which becomes a recorded image. Then, when the entire surface of the coated side is exposed to light, the microcapsules which remain unruptured are hardened from the inside and become no longer rupturable even if pressure is applied thereto, thus allowing fixing of the recorded image. The described recording sheet of this invention is not only applicable for the fixing of the recorded image; it is also possible to momentarily form a so-called desensitized portion by light. In the latter case, that part of the recording sheet which is not required for the recording is beforehand exposed before use of the sheet. The photosetting capsules in the exposed part of the sheet are hardened and therefore are not ruptured even when pressure is applied thereto during recording, and hence no color recorded image is produced.

As a modification of said monosheet type recording sheet, a photosetting resin may be contained in the co-reactant-containing microcapsules, too, to form the photosetting microcapsules and such microcapsules may be coated together with the reactant-containing photosetting microcapsules on the same side of the support.

This modified recording sheet is also capable of recording the drawings, characters, etc., of the original by the same operations as said above. Furthermore, this recording sheet can also be used as photofixable pressure-sensitive recording sheet as explained above.

The "reactant" and "co-reactant" used in the recording paper of this invention mean the reactive compounds which react each other upon being contacted with each other to produce a colored material. For instance, in case a colored material is produced from a combination of a colorless electron donative compound and a colorless electron receptive compound, if the electron donative compound is used as reactant, then the electron receptive compound is the co-reactant, while if the electron receptive compound is the reactant, then the electron donative compound is the co-reactant. Such reactive compound combinations include the combination of ligand and polyvalent metallic compounds. Such reactive compounds are explained more definitely below. As examples of the electron donative compounds, there may be cited the triarylmethane compounds such as 3,3-bis(p-dimethylaminophenyl)-6-dimethylaminophthalide, 3,3-bis(p-dimethylaminophenyl)phthalide, 3-(p-dimethylaminophenyl)-3-(1,2-dimethylindole-3-yl)phthalide, etc.; diphenylmethane compounds such as 4,4'bisdimethylaminobenzohydrinbenzyl ether; xanthene compounds such as 3-dimethylamino-7-methoxyfluoran, 3-diethylamino-7-chlorofluoran, 3-diethylamino-7-dibenzylaminofluoran, etc.; thiazine compounds such as benzoylleucomethylene blue; and spiro compounds such as 3-methyl-spiro-dinaphthopyran, 3-propyl-spirodibenzopyran, etc.

As examples of the electron receptive compounds usable in this invention, there may be cited the inorganic acid materials such as acid clay, active clay, kaolin, zeolite, bentonite, etc.; substituted phenolic compounds such as p-cresol, p-octylphenol, p-cyclohexylphenol, p-phenylphenol, α-naphthylphenol, cumylphenol, p-chlorophenol, etc.; phenolic resin compounds such as phenol-formalin condensate, substituted phenol-formalin condensate, etc., and their metallic salt-modified phenolic resins such as those modified with a polyvalent metal such as zinc, nickel, etc.; aromatic carboxylic acid compounds such as p-butylbenzoic acid, p-hydroxybenzoic acid, 2,5-dihydroxybenzoic acid, salicylic acid, 5-tertbutylsalicyclic acid, 3,5-di(α-methylbenzyl)salicyclic acid, etc., and their metallic salts formed by using polyvalent metals such as zinc, nickel, etc., and mixtures of aromatic carboxylic acid compounds and polyvalent metallic compounds such as zinc acetate, zinc propionate, etc.

Exemplary of the ligands usable in this invention are 8-quinolinol, gallic acid, dodecyl gallate ester, 1,10-phenanethroline, o-phenylenediaminediphenylthiourea, guanidine, hydroxynaphthoic acid, dipivaloylmethane, trifluoroacetylacetone and the like. Exemplary of the metallic compounds are ferric stearate, magnesium stearate, zinc stearate, zinc N-phenyl-N-ethyldithiocarbamate and the like.

In order to encapsulize the co-reactants used in this invention, it is preferred to previously dissolve them in oily solvents. As these solvents, those of high boiling points are used. Examples thereof are those of alkylnaphthalene, chlorinated paraffins, diarylethane, alkyldiphenyl, aromatic ester, fatty acid ester series. These may also be used in admixture of two or more.

The reactant and/or co-reactant which are also contained in the capsules may be added in such amounts that do not obstruct curing of the photosetting resin. They are usually used in an amount of about 0.01 to about 40% by weight of the photosetting resin, but it is advantageous from the economical aspect to add them in an amount of about 0.1 to about 20% by weight of the photosetting resin.

A water-soluble binder or a latex is usually used for holding the photo- and pressure-sensitive layer of the photo- and pressure-sensitive recording sheet of this invention on a support. Exemplary of the water-soluble high polymer binders and latices usable for said purpose are gelatin, casein, carboxymethyl cellulose, hydroxymethyl cellulose, oxidized starch, esterified starch, polyvinyl alcohol, polyvinyl pyrrolidone, polyacrylic acid, vinyl acetate-acrylic acid copolymer, acrylonitrile-butadiene copolymer, vinylidene chloride copolymer and the like. Any suitable one or a suitable combination of these substances is selected by taking into consideration the film strength, dispersability and other matters.

The photo- and pressure-sensitive layer of the photo- and pressure-sensitive recording sheet of this invention may further contain a capsule protective agent such as cellulose powder, starch particles, plastic particles, etc., an inorganic pigment such as talc, calcium carbonate, zinc oxide, titanium oxide, etc., an organic pigment such as urea-formalin resin, or other agent such as dispersing medium, defoaming agent, etc.

As for the microcapsule coating means, there may be employed any known suitable method such as coating the microcapsules on the entire surface of a support by means of an air-knife coater, blade coater, gravure coater or such, or coating the microcapsules on a part of the support by using a flexographic printing press, photogravure press or such.

As the support, one may optionally select a transparent, translucent or opaque support material such as, for example, paper, various types of nonwoven fabrics, synthetic paper, metal foils, plastic films, etc., or a composite sheet using these materials in combination.

The present invention is described in further detail hereinbelow by citing the examples thereof. In the following descriptions of the examples, all "parts" are by weight unless otherwise noted.

EXAMPLE 1

A photosetting microcapsule dispersion was prepared in the following way. A mixture consisting of 80 parts of an epoxy acrylate photosetting resin (trade name "Ripoxy" available from Showa Kobunshi Co., Ltd.) and 0.2 part of benzoinethyl ether was emulsified in 100 parts of a 5% aqueous solution (pH 4.0) of a styrene-maleic anhydride copolymer and a small quantity of sodium hydroxide. On the other hand, a mixture composed of 10 parts of melamine, 25 parts of a 37% formaldehyde solution and 65 parts of water was adjusted to pH 9 with sodium hydroxide and heated to 60° C., whereby the mixture became transparent in 15 minutes to obtain a melamine-formaldehyde precondensate. This precondensate was added to the previously prepared emulsion and the mixture was stirred at 60° C. for 4 hours and then cooled to room temperature.

To 50 parts of the resulting photosetting microcapsule dispersion were added 20 parts of a 10% polyvinyl alcohol solution and 40 parts of water, and after stirring well, the mixed solution was uniformly coated on a paper of a basic weight of 50 g/m² by meyer bar and dried. A black paper was placed over a part of the coated surface of the thus formed photosetting microcapsule sheet and the sheet was exposed to xenon light five times from the coated surface side by using Riso Xenofax FX-150. Then the black paper was removed and the sheet was pressed over its entire surface by a press roll, and then the exposed portion and the non-exposed portion of the sheet were observed under an electron microscope, whereby it was confirmed that while the microcapsules in the exposed portion were not ruptured and maintained their spherical form, the microcapsules in the non-exposed portion were all ruptured.

EXAMPLE 2

A photosetting microcapsule dispersion was prepared in the same way as Example 1 except that the mixture of 80 parts of an epoxy acrylate photosetting resin and 0.2 part of benzoinethyl ether was replaced by a mixture of 80 parts of an oligoester acrylate photosetting resin (trade name "Aronix" available from Toagosei Chemical Industries Co., Ltd.), 3 parts of 3-diethylamino-7-chlorofluoran and 0.2 part of benzoinethyl ether. To 50 parts of this dispersion were added 20 parts of a 10% aqueous polyvinyl alcohol solution and 40 parts of water and the mixed color, after stirred well, was uniformly coated on a paper having a basic weight of 50 g/m² by meyer bar and dried. The coated side of the thus obtained photosetting microcapsule sheet was subjected to xenon light flash exposure 1–5 times by using Riso Xenofax FX-150, and this exposed sheet was placed overlaying an image-receiving sheet coated with a mixed dispersion of 3,5-di-tert-butylsalicylic acid and zinc oxide such that their respective coated sides opposed to each other, followed by pressing over the entire surface thereof by a press roll. There was consequently formed on the image-receiving sheet a red color image which differed in density according to the number of flash exposures. Table 1 shows the relation between the number of flash exposure and red color density of the red color image formed on the image-receiving sheet.

TABLE 1

| Number of flash exposures (times) | Red color density on image-receiving sheet |
|---|---|
| Unexposed | 0.73 |
| 1 | 0.48 |
| 2 | 0.25 |
| 3 | 0.12 |
| 4 | No color developed. |
| 5 | No color developed. |

It is seen from Table 1 that the reactant-containing photosetting microcapsules, when not exposed to light, are perfectly ruptured upon application of a pressure and a high-density color image is formed on the image-receiving sheet, but as the number of exposure increases, the microcapsules are hardened progressively and the number of the microcapsules ruptured decreases. Thus, the color density lowers proportionally to the exposure number, and when the microcapsules are perfectly hardened into rigid capsules, there no longer takes place any rupture of the capsules and accordingly no color development occurs on the image receiver sheet.

EXAMPLE 3

(1) 80 parts of an acrylate type photosetting resin (trade name "Aronix" available from Toagosei Chemical Industries, Co., Ltd.) having dissolved therein 2.4 parts of 3-(4-diethylamino-2-ethoxyphenyl)-3-(1-ethyl-2-methylindole-3-yl)-4-azaphthalide which is an electron donative compound serving as a reactant and 0.2 part of benzoinethyl ether was emulsified in 100 parts of a 5% aqueous solution (pH 4.0) of a styrene-maleic anhydride copolymer and a small quantity of sodium hydroxide.

On the other hand, a mixture composed of 10 parts of melamine, 25 parts of a 37% aqueous formaldehyde solution and 65 parts of water was adjusted to pH 9 with sodium hydroxide and heated to 60° C., whereby the mixture became transparent in 15 minutes and a melamineformaldehyde precondensate was obtained. This precondensate was added to said emulsion and the mixture was stirred at a liquid temperature of 60° C. for 4 hours and then cooled to room temperature. The solid content of the resultantly obtained microcapsule dispersion was approximately 45%.

To 220 parts of the thus obtained photosetting microcapsule dispersion were added 150 parts of a 10% polyvinyl alcohol and 200 parts of water, and the mixture was stirred well and coated on a base paper having a basic weight of 40 g/m$^2$ to a coating amount of 4 g/m$^2$ by using meyer bar to obtain a photo- and pressure-sensitive recording sheet.

(2) 100 parts of active clay (trade name "Silton"), 20 parts of zinc oxide, 38 parts of SBR latex (48%) and 300 parts of water were mixed and stirred, and the mixture was coated on a 50 g/m$^2$ base paper to a coating amount of 6 g/m$^2$ by using meyer bar to obtain an image-receiving sheet.

(3) The recording sheet obtained in (1) and an original to be copied (a handwritten translucent paper) were laid one on top of another such that the coated side of said recording sheet and the handwritten side of the original paper opposed to each other, followed by xenon light exposure from the original paper side by using Riso Xenofax FX-150. Then the thus treated sheet was placed on the coated side of the image-receiving sheet obtained in (2) and then passed between the rubber rolls for giving pressure, whereupon bluish purple colored copy images of the handwritten characters on the original appeared on the image-receiving sheet. No color developed in other parts than the characters.

EXAMPLE 4

(1) A photosetting microcapsule dispersion with a solid content of approximately 45% was prepared in the same manner as in (1) of Example 3 except for use of 4.0 parts of zinc 3,5-di-tert-butylsalicylate as the electron receptive compound instead of 2.4 parts of 3-(4-diethylamino-2-ethoxyphenyl)-3-(1-ethyl-2-methylindole-3-yl)-4-azaphthalide.

220 parts of the thus obtained microcapsule dispersion was added with 150 parts of 10% ammonium polyacrylate, and the mixed solution was stirred well and then coated on a polyester film of 20μ thick to a coating weight of about 5 g/m$^2$ by using meyer bar to obtain a photo- and pressure-sensitive recording sheet.

(2) 33 parts of a 30% aqueous dispersion of diethylamino-7-chlorofluoran, 120 parts of a 10% polyvinyl alcohol, 50 parts of zinc oxide and 40 parts of water were mixed and stirred well, and the mixed solution was coated on a base paper of a basic weight of 50 g/m$^2$ to a coating weight of 7 g/m$^2$ with meyer bar to obtain an image-receiving sheet.

(3) The recording sheet obtained in (1) and an original to be copied (a book) were superposed one upon another such that the coated side of the copying sheet faced the printed side of the original, and this double layered sheet was exposed to xenon light from the copying sheet side by using Riso Xenofax FX-150, then placed on the coated side of the image-receiving sheet obtained in (2) and passed between the rubber rollers for giving pressure, whereby a red colored image of the same printing pattern as the original appeared on the image-receiving sheet. No color developed at all in other parts than the printing pattern.

Observation by an electron microscope of 1,000 magnifications showed that the microcapsules in the character portion in Example 3 and in the printing pattern portion of Example 4 were completely ruptured while the microcapsules in the parts other than the character portion of Example 3 and the printing pattern portion of Example 4 maintained their spherical form.

EXAMPLE 5

(1) A reactant-containing photosetting microcapsule dispersion was prepared after the manner of Example 3 (1).

(2) A co-reactant-containing microcapsule dispersion was also prepared in the same way as Example 3 (1) except that 8.0 parts of 3,5-di-tert-butylsalicylic acid was used as electron receptive compound (co-reactant) instead of 2.4 parts of 3-(4-diethylamino-2-ethoxyphenyl)-3-(1-ethyl-2-methylindole-3-yl)-4-azaphthalide and 72.0 parts of Nisseki Hisol N-296 (an oil produced by Nippon Petrochemical Co., Ltd.) was used instead of 0.2 part of benzoinethyl ether and 77.4 parts of acrylate type photosetting resin. The solid content of this dispersion was approximately 45%.

(3) A coating color prepared by dispersing 30 parts of zinc oxide and 5 parts of polyvinyl alcohol in 65 parts of water was coated on a paper of a basic weight of 50 g/m$^2$ to a coating amount of 2.0 g/m$^2$ by using meyer bar and the coated paper was passed once through a supercalender. Then another coating color of the following composition was further coated on the obtained zinc oxide prime-coated paper to a coating amount of 50 g/m$^2$.

| Composition of another coating color: | |
| --- | --- |
| Reactant-containing photosetting microcapsule dispersion obtained in (1) | 22 parts |
| Co-reactant-containing microcapsule dispersion obtained in (2) | 44 parts |
| Wheat starch | 10 parts |
| Polyvinyl alcohol | 3 parts |
| Water | 172 parts |

The thus obtained photo- and pressure-sensitive recording sheet and an original to be copied (a translucent handwritten paper) were superposed one upon another such that the coated side of said recording sheet faced the rear side of the handwritten paper, and after exposing to xenon light from the original side by using Riso Xenofax FX-150, the photo- and pressure-sensitive recording sheet was passed through the rubber rolls for giving pressure, whereby the vivid blue colored copy images of the same characters as the original were formed on said recording sheet. Other parts than the characters showed no color development and remained white.

EXAMPLE 6

A reactant-containing photosetting microcapsule dispersion was prepared in the same manner as Example 3 (1) except for use of 3-diethylamino-7-chlorofluoran instead of 3-(4-diethylamino-2-ethoxyphenyl)-3-(1-ethyl-2-methylindole-3-yl)-4-azaphthalide. 100 parts of this 45% microcapsule dispersion, 100 parts of Silton serving as the co-reactant, 20 parts of a 30% aqueous dispersion of zinc 3,5-di-tert-butylsalicylate, 12 parts of a 25% aqueous solution of ammonium polyacrylate were mixed in 590 parts of water to form a coating color, and this coating color was coated on a 20 μm thick polyester film to a coating weight of 8 g/m² with meyer bar.

The thus obtained photo- and pressure-sensitive recording sheet and an original to be copied (a book) were placed one upon another such that the non-coated side of said recording sheet faced the printed side of the original, and after xenon light exposure from the recording sheet side by using Riso Xenofax FX-150, said recording sheet was pressed by passing it between the rubber rolls. Whereupon a copy image of the pattern on the original appeared in vivid red on said recording sheet. No coloration occured at other section than the characters.

EXAMPLE 7

When the pressure-sensitive recording paper obtained in Example 5 was typewritten by an IBM typewriter Model 82C without any ribbon, blue letters were formed on said recording paper. The coated side of this recording paper having said color image formed thereon was exposed to xenon light by using Riso Xenofax FX-150 and again subjected to typewriting by the same typewriter as said above, but there appeared no blue color image.

EXAMPLE 8

A reactant-containing photosetting microcapsule dispersion was prepared in the same way as Example 3 (1) except for use of 3-diethylamino-7-chlorofluoran instead of 3-(4-diethylamino-2-ethoxyphenyl)-3-(1-ethyl-2-methylindole-3-yl)-4-azaphthalide, and 100 parts of this 45% microcapsule dispersion was mixed with 100 parts of Silton (co-reactant), 20 parts of a 30% aqueous dispersion of zinc 3,5-di-tert-butylsalicylate, 12 parts of a 25% aqueous solution of ammonium polyacrylate and 590 parts of water to form a coating color, and this coating color was coated on a base paper of a basic weight of 50 g/m² to a coating amount of 12 g/m² by meyer bar.

When letters were typewritten on the thus obtained photo-fixed type self contained pressure-sensitive recording paper by IBM Typewriter Model 82C with its ink ribbon removed, the corresponding red letters were formed on the recording paper. The coated side of this recording paper carrying said color images was exposed to xenon light by using Riso Xenofax FX-150 and again subjected to typewriting by the same typewriter as said above, but no red color image was formed.

EXAMPLE 9

(1) A reactant-containing photosetting microcapsule dispersion was prepared by following the same procedure as Example 3 (1) except that 4.0 parts of zinc 3,5-di-tert-butylsalicylate was used as electron receptive compound (reactant) instead of 3-(4-diethylamino-2-ethoxyphenyl)-3-(1-ethyl-2-methylindole-3-yl)-4-azaphthalide.

(2) A co-reactant-containing microcapsule dispersion was prepared in the same way as Example 5 (2) except that 12.0 parts of 3-diethylamino-6-methyl-7-anilinofluoran was used as electron donative compound (co-reactant) instead of 3,5-di-tert-butylsalicylic acid.

(3) 45 parts of the 45% microcapsule dispersion obtained in (1) above, 45 parts of the 45% microcapsule dispersion obtained in (2) above, 12 parts of wheat starch, 52 parts of a 10% aqueous solution of oxidized starch and 32 parts of water were mixed and stirred well, and this color was coated on a base paper having a basic weight of 50 g/m² to a coating amount of 10 g/m² by using meyer bar. Typing was performed on the thus obtained photo-fixed type self contained pressure sensitive recording paper by an IBM Typewriter Model 82C without any ribbon, forming the black letters on the recording paper. The coated side of this recording paper carrying said color image was exposed to xenon light and again typing was performed thereon by using said typewriter, but no black color image was formed.

EXAMPLE 10

(1) The reactant-containing photosetting microcapsules were prepared in the following way.

100 parts of a 10% aqueous solution of an ethylene-maleic anhydride copolymer, 10 parts of urea, 1 part of resorcin and 200 parts of water were mixed and this solution was adjusted to pH 3.5 with an aqueous solution of sodium hydroxide. Then 172.8 parts of an epoxy acrylate type photosetting resin (trade name "Ripoxy" available from Showa Kobunshi Co., Ltd.) in which 7.2 parts of 3-diethylamino-6-methyl-7-anilinofluoran which is an electron donative compound serving as reactant and 0.5 part of benzoinethyl ether were dissolved was dispersed and emulsified in the above-said mix solution to form an oil-in-water type emulsion with an oil particle size of 4–8 microns. This emulsion was then added with 25 parts of a 37% formaldehyde solution, stirred for 4 hours while maintaining the liquid temperature at 55° C. and then cooled to room temperature to complete the encapsulization.

(2) The co-reactant-containing photosetting microcapsules were prepared in the same manner as described above (1) except that 3-diethylamino-6-methyl-7-anilinofluoran was replaced by 9.0 parts of 3,5-di-tert-butylsalicylic acid which was an electron receptive compound (co-reactant) and 11.5 parts of Octhix "Zn" (produced by Nippon Kagaku Sangyo Co., Ltd.).

(3) A coating color of the following composition was prepared, and this color was coated on a 50 g/m² paper to a coating weight of 7 g/m² by using meyer bar.

| Coating color composition: | |
|---|---|
| Reactant-containing photosetting microcapsule dispersion obtained in (1) | 22 parts |
| Co-reactant-containing photosetting microcapsule dispersion obtained in (2) | 44 parts |

| Coating color composition: | |
|---|---|
| 10% polyacrylamide solution | 26 parts |
| Water | 50 parts |

The thus obtained photo- and pressure-sensitive recording sheet and an original to be copied (a translucent paper carrying the handwritten letters) were superposed one upon another such that the coated side of the recording sheet faced the rear side of the manuscript paper, and after xenon light exposure from the original side by using Riso Xenofax FX-150, the photo- and pressure-sensitive recording sheet was pressed by passing it between the rubber rolls, whereby the black colored copy images of the same letters as the original were formed on said recording sheet. No coloration occured in other area than the letters and such area remained white.

EXAMPLE 11

(1) A reactant-containing photosetting microcapsule dispersion was prepared in the following way.

80 parts of an oligoester acrylate type photosetting resin (trade name "Aronix" available from Toagosei Checmical Industries Co., Ltd.) in which 2.4 parts of 3-(4-diethylamino-2-ethoxyphenyl)-3-(1-ethyl-2-methylindole-3-yl)-4-azaphthalide, used as electron donative compound serving as reactant, and 0.2 part of benzoinethyl ether were dissolved was emulsified in 100 parts of a 5% aqueous solution (pH 4.0) of a styrene-maleic anhydride copolymer and a minority of sodium hydroxide. On the other hand, 10 parts of melamine, 25 parts of a 37% formaldehyde solution and 65 parts of water were mixed and this mixture was adjusted to pH 9 with sodium hydroxide and heated to 60° C., whereupon the mixed solution became transparent in 15 minutes to form a melamine-formalin precondensate. This precondensate was added to the above-said emulsion, stirred for 4 hours at a liquid temperature of 60° C. and then cooled to room temperature. The resultantly obtained microcapsule dispersion had a solid content of approximately 45%.

(2) A co-reactant-containing photosetting microcapsule dispersion was prepared in the same way as described in (1) above except that 8.0 parts of 3,5-di-tert-butylsalicylic acid was used as electron receptive compound (co-reactant) instead of 3-(4-diethylamino-2-ethoxyphenyl)-3-(1-ethyl-2-methylindole-3-yl)-4-azaphthalide. The solid content of this dispersion was approximately 45%.

(3) A coating color was prepared by dispersing 30 parts of zinc oxide and 5 parts of polyvinyl alcohol in 65 parts of water, and this coating color was coated on a 50 g/m² base paper to a coating amount of 2.0 g/m² by using meyer bar and then passed once through a supercalender. The thus obtained zinc oxide primed paper was further coated with another coating color of the following composition to a coating weight of 3.0 g/m².

| Composition of another coating color: | |
|---|---|
| Reactant-containing photosetting microcapsule dispersion obtained in (1) | 22 parts |
| Co-reactant-containing microcapsule dispersion obtained in (2) | 44 parts |

| Composition of another coating color: | |
|---|---|
| Wheat starch | 10 parts |
| Polyvinyl alcohol | 3 parts |
| Water | 172 parts |

When types were impressed on the thus obtained photo- and pressure-sensitive recording sheet by an IBM Typewriter Model 82C without any ribbons, the corresponding blue colored characters were formed on the recording sheet. This recording paper carrying said color images had its coated side exposed to xenon light by using Riso Xenofax FX-150 and was again subjected to type impression by using the same typewriter, but no blue color image was formed in this case.

What is claimed is:

1. A photo- and pressure-sensitive recording sheet which comprises a support having thereon a photo- and pressure-sensitive layer comprising (1) photosetting microcapsules containing principally a photosetting resin, a reactant and a photopolymerization initiator and (2) microcapsules containing a co-reactant forming a colored material upon contact with said reactant.

2. A photo- and pressure-sensitive recording sheet which comprises a support having thereon a photo- and pressure-sensitive layer comprising photosetting microcapsules containing principally a photosetting resin a reactant and photopolymerization initiator and photosetting microcapsules containing a photosetting resin, a photopolymerization initiator and a co-reactant which forming a colored material upon contact with said reactant.

3. The recording sheet according to claim 1 or 2, wherein the photosetting resin is selected from the photo-dimerization type resins having a photosensitive group such as cinnamic acid residue, cinnamylidene residue, $\alpha,\beta$-unsaturated ketone residue, cumarin residue, anthracene residue, $\alpha$-phenylmaleimide residue, benzophenone residue, and stilbene residue; photo-decomposition type resins having a photosensitive group such as diazonium salt residue, quinonediazide residue, azide residue, dithiocarbamate residue, and benzoin residue; and photopolymerization type resins having an acryloyl group, allyl group, vinyl group, and epoxy group.

4. A copying method which comprises exposing a recording sheet in superposed relation with an original to be copied to harden photosetting microcapsules in said recording sheet in areas corresponding to non-image areas of said original, said recording sheet comprising a support having thereon a photo-and pressure-sensitive layer comprising (1) photosetting microcapsules containing principally a photosetting resin, a photopolymerization initiator and a reactant and (2) microcapsules containing a co-reactant which forms a colored material upon contact with said reactant and then pressing the sheet to form a copy image.

5. A copying method which comprises exposing a recording sheet in superposed relation with an original to be copied to harden photosetting microcapsules in said recording sheet in areas corresponding to non-image areas of said original, said recording sheet comprising a support having thereon a photo- and pressure-sensitive layer comprising (1) photosetting microcapsules containing principally a photosetting resin, a photopolymerization initiator and a reactant and (2) photosetting microcapsules containing a photosetting resin, a photopolymerization initiator and a co-reactant which forms a colored material upon contact with said reactant, and then pressing the sheet to form a copy image.

6. A copying method which comprises impressing characters on a photo- and pressure-sensitive recording sheet comprising a support having thereon a photo- and pressure-sensitive layer comprising (1) photosetting microcapsules containing principally a photosetting resin, a photopolymerization initiator and a reactant and (2a) microcapsules containing a co-reactant which forms a colored material upon contact with said reactant or (2b) finely powdered co-reactant to form a copy image and then exposing the entire surface of said image-formed sheet to obtain a fixed copy image.

7. A copying method which comprises impressing characters on a photo- and pressure-sensitive recording sheet comprising a support having thereon a photo- and pressure-sensitive layer comprising photosetting microcapsules containing principally a photosetting resin, a photopolymerization initiator and a reactant and microcapsules containing a photosetting resin, a photopolymerization initiator and a co-reactant which forms a colored material upon contact with said reactant to form a copy image and then exposing the entire surface of this image-formed sheet to obtain a fixed copy image.

8. The copying method according to claim 4, 5, 6 or 7, wherein the reactant is an electron donative compound and the co-reactant is an electron receptive compound.

9. The copying method according to claim 4, 5, 6 or 7, wherein the reactant is an electron receptive compound and the co-reactant is an electron donative compound.

10. The copying method according to claim 4, 5, 6 or 7, wherein the reactant is a ligand and the co-reactant is a polyvalent metallic compound.

11. The copying method according to claim 4, 5, 6 or 7, wherein the reactant is a polyvalent metallic compound and the co-reactant is a ligand.

12. The recording sheet according to claim 1, or 2, wherein the reactant is an electron donative compound and the co-reactant is an electron receptive compound.

13. The recording sheet according to claim 1, or 2, wherein the reactant is an electron receptive compound and the co-reactant is an electron donative compound.

14. The recording sheet according to claim 1 or 2, wherein the reactant is a ligand and the co-reactant is a polyvalent metallic compound.

15. The recording sheet according to claim 1 or 2, wherein the reactant is a polyvalent metallic compound and the co-reactant is a ligand.

* * * * *